United States Patent [19]

Loh

[11] Patent Number: 4,939,479
[45] Date of Patent: Jul. 3, 1990

[54] AUDIO AMPLIFIER

[75] Inventor: Gee H. Loh, Singapore, Singapore

[73] Assignee: SGS-Thomson Microelectronics (Pte) Ltd., Singapore, Singapore

[21] Appl. No.: 401,056

[22] Filed: Aug. 31, 1989

[51] Int. Cl.$^5$ .............................................. H03F 3/45
[52] U.S. Cl. ...................................... 330/257; 330/311
[58] Field of Search ....................... 330/257, 261, 311

[56] References Cited

FOREIGN PATENT DOCUMENTS 112009  8/1980  Japan .................................. 330/311

Primary Examiner—James B. Mullins
Attorney, Agent, or Firm—Wenderoth, Lind & Ponack

[57] ABSTRACT

An audio amplifier comprises a first current mirror having an input coupled to an output of a cascade differential pair and an output coupled to an output of a first constant current source. A second constant current source (Q16, Q18, CC10) supplies the voltage reference (Q15) of the first constant current source. Hitherto a resistor has been used instead of the second constant current source to reduce noise. However, using a resistor results in the amplifier having a relatively low power supply rejection ratio, thereby degrading the performance of the amplifier. Accordingly the present invention uses a second constant current source to improve the power supply rejection ratio without degrading the noise performance.

3 Claims, 3 Drawing Sheets

AUDIO AMPLIFIER

BACKGROUND OF THE INVENTION (a) Field of the invention

The present invention relates to an audio amplifier.

In audio frequency equipment it is desirable to be able to amplify a low level audio signal by means of an amplifier to a large level without introducing any unwanted noise. The input stage of the amplifier may be provided by a number of arrangements. Any such arrangement, however, should enable the non-inverting input to be biased at ground level. Having the non-inverting input biased at ground level obviates the need for any d.c. blocking capacitor and furthermore enables a controlling component such as a variable impedance to be used which is normally referenced to ground potential. An arrangement at the input stage should also enable the inverting input to be biased not at ground potential since the inverting input is always connected to a feedback network in order to define the closed loop gain as well as the output d.c. level.

Description of the Prior Art

Known devices have employed a cascade differential pair at the input stage since it meets the aforesaid requirements and also provides a relatively low noise.

A cascade differential pair consists, for example, of a pair of transistors (or compound transistors) of opposite polarities whose emitters are connected together.

Alternatively a common emitter differential ("long-tailed") pair has been used with a level shift transistor at its non-inverting input. However, the unity gain of the level shift transistor greatly degrades the noise performance of the amplifier.

Advantageous parameters required by the input stage of an audio amplifier are as follows: (1) the non-inverting input must be ground compatible; (2) the inverting input must be non-ground compatible; (3) relatively low noise; (4) a high output impedance; (5) a high ripple rejection; (6) and an inverting input/output characteristic.

Previously proposed audio amplifiers incorporating a cascade differential pair at the input stage have not met all of the above criteria. For example FIG. 1 of the accompanying drawings illustrates an audio amplifier using a cascade differential pair. Transistor Q9 and the cascade differential pair (Q1 and Q2) form the input stage of the amplifier. Current source CC100 and current mirror transistors Q106 and Q9 are major noise contributors. The input stage has a high output impedance but does not have an inverting input/output characteristic. Hence the amplifier requires two more inverting gain stages (Q100 and Q101), which increases the noise contribution and means that an external capacitor is required to stabilize the amplifier.

Another known audio amplifier is shown in FIG. 2 of the accompanying drawings. The input stage is formed by a cascade differential pair (Q1 and Q2) and a resistive load R100. The noise from the input stage is low but it provides low output impedance and has a non-inverting input/output characteristic. Accordingly a non-inverting gain stage is required and is provided by transistors (Q102, Q103, Q104 and Q105) forming a two gain stage amplifier. Again an external capacitor is required because the Miller effect compensation is not sufficient for the non-inverting gain stage.

Another known audio amplifier is shown in FIG. 3 of the accompanying drawings, where the input stage of the amplifier comprises a cascade differential pair Q1, Q2; a current mirror formed by transistors Q3, Q4 and resistors R1, R2; and an active load in the form of a constant current source provided by a transistor Q5, resistors R3 to R6, and diode-connected transistors Q6, Q7. This input stage provides a high output impedance, low noise and an inverting input/output characteristic. The input stage enables the use of a single further gain stage formed by a common emitter transistor Q8 with a constant current source CC1 as the collector load. The amplifier thus has only two gain stages and a single integrated compensating capacitor C1 is sufficient to ensure stability, thus obviating the need for any external compensating capacitor to stabilize the amplifier. However the amplifier does not meet all of the aforesaid requirements. The resistor R4 is provided instead of a constant current source previously used. Although resistor R4 reduces the noise contribution, it injects ripple into the amplifier. In some cases the power supply rejection ratio can be as low as 0 dB.

SUMMARY OF THE INVENTION

According to the present invention there is provided an audio amplifier comprising a first current mirror having an input and an output, a cascade differential pair having an output, a first constant current source having an output a second constant current source, a resistor, and a power supply line, said input of said first current mirror being coupled to said output of said cascade differential pair and said output of said first current mirror being coupled to said output of said first constant current source, said first constant current source comprising first and second transistors each having a base, a collector, and an emitter, said collector of said first transistor providing said output of said first constant current source, said base of said first transistor being coupled to said collector of said second transistor, said emitter of said first transistor being coupled to said base of said second transistor and via said resistor to said power supply line, said emitter of said second transistor being coupled to said power supply line, said second constant current source being connected to said collector of said second transistor.

DESCRIPTION OF THE PREFERRED EMBODIMENT

Figure 1:
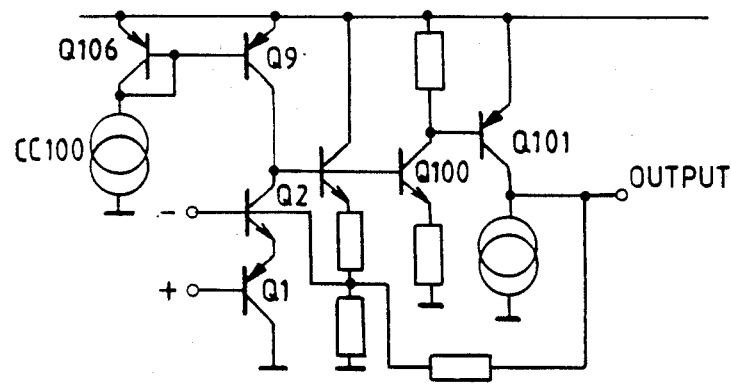
FIGS. 1, 2 and 3 are schematic diagrams of amplifiers according to the prior art.
Figure 2:
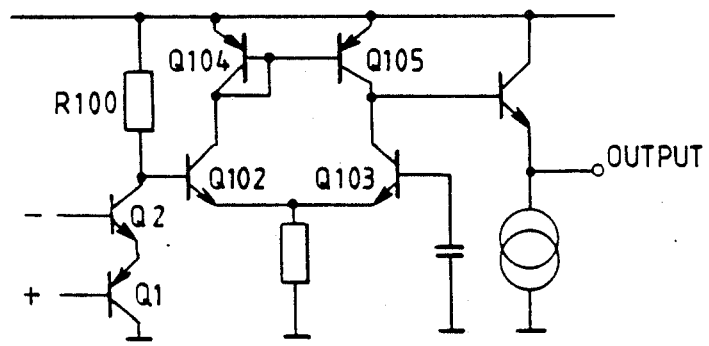
Figure 3:
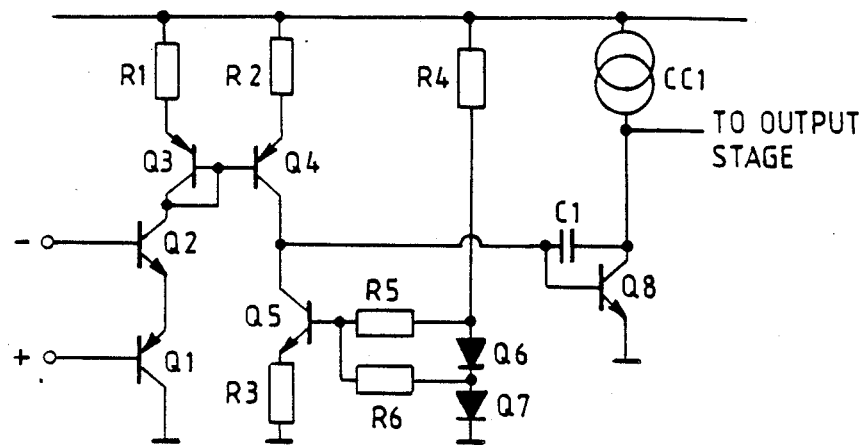
Figure 4:
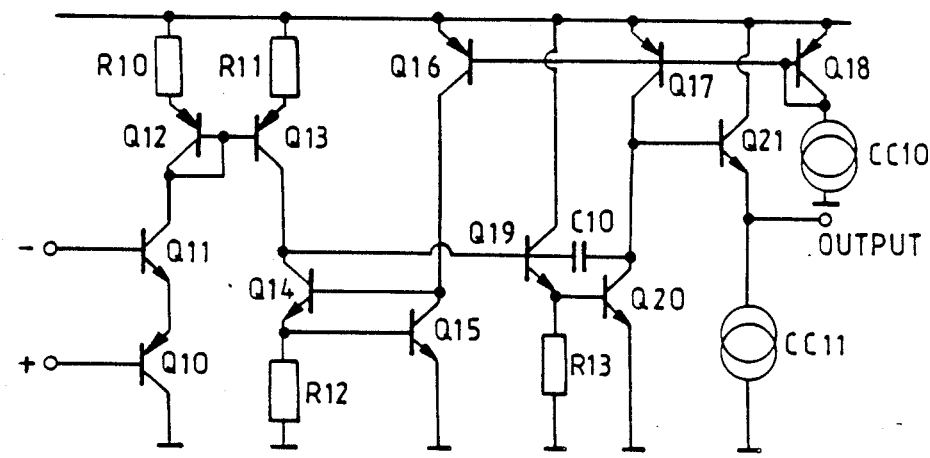
FIG. 4 is a schematic diagram of an amplifier according to an embodiment of the present invention.

The embodiment of the present invention shown in FIG. 4 has as its input stage a cascaded differential pair Q10, Q11, a current mirror formed by transistors Q12, Q13 and resistors R10, R11, and an active load in the form of a constant current source comprising transistors Q14, Q15 and resistor R12. The major noise contribution is from the cascade differential pair Q10, Q11; noise generated by the current mirror Q12, Q13, R10, R11 may be reduced by suitable selection of the emitter degeneration resistors R10, R11. Likewise noise from the active load Q14, Q15, R12 may be minimised by suitable selection of the resistor R12. The embodiment of the present invention enables the noise from the active load to be minimised even further whilst obviating the need for the resistor R4 provided in the prior art shown in FIG. 3. Thus, the embodiment of the present invention reduces noise whilst providing a relatively high power supply rejection ratio. This input stage provides a high output impedance, low noise and an inverting input/output characteristic. Consequently this enables a further single gain stage to be used which comprises transistors Q19, Q20 and resistor R13. This amplifier thus has two gain stages with a single internal capacitor C10 for stability, again obviating the need for any external compensating capacitor. The output from the common emitter transistor Q20 is coupled to an emitter-follower Q21 providing an output for the amplifier across an active load provided by a third constant current source CC11.

This embodiment of the present invention therefore fulfills all of the aforesaid requirements, namely that the circuit features input ground compatibility, low noise, high output impedance, high ripple rejection and inverting input/output characteristics.

Figure 5:
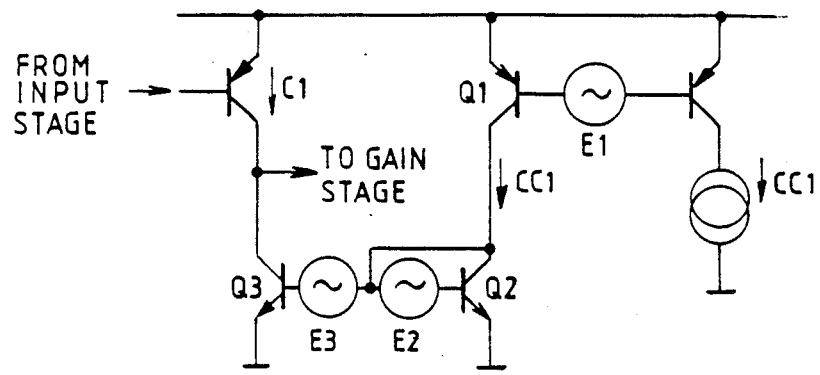
FIG. 5 is a schematic diagram illustrating the prior art with equivalent noise sources.
Figure 6:
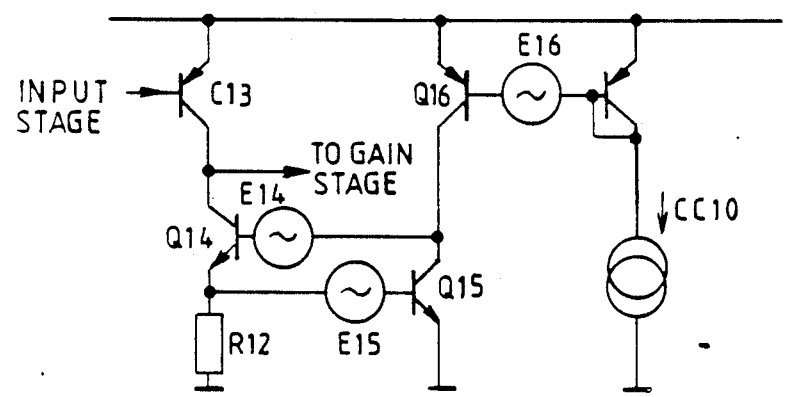
FIG. 6 is a schematic diagram illustrating the embodiment of the present invention with equivalent noise sources.

The low noise characteristic can be exemplified by referring to FIGS. 5 and 6.

For a typical prior art arrangement shown in FIG. 5, E1, E2 and E3 are equivalent noise sources generated by transistors Q1, Q2 and Q3 respectively. The voltage gain of Q1 is unity, in that the noise contribution by E1 will appear at the base of Q3. The noise sources can be assumed to be of the same order, so that the total noise at the base of Q3 will equal $\sqrt{3}$ E1.

The voltage gain of Q3 can be calculated by its collector current, i.e.

$$gain\ (Q3) = Ro*Ic1/V = 1M*50uA/26mV = 66dB\ if\ Ro \sim 1M\Omega$$

Therefore E1 will be amplified by $66dB + 20LOG\ \sqrt{3} = 71dB$ and appear at the collector of Q3.

Referring now to FIG. 6 which illustrates the noise analysis of the preferred embodiment, the voltage gains of Q16 and Q15 are 2 and 1 respectively. The contributions of noise sources E16, E15 and E14 will appear at the base of Q14 as $\sqrt{6}E16$ assuming that E16 = E15 = E14

The voltage gain of $Q14 = Ro/R12 = 1M/10K = 40dB$ if $Ro \sim 1m\Omega$ and $R12 = 10K$.

Thus the total noise appearing at the collector of Q14 will be equal to $40dB + 20LOG\ \sqrt{6})*E16 = 48dB*E16$. Compared to the prior art there is 21 dB reduction in noise contribution from using the active load.

For the same reason, ripple rejection from this path is very high.

The aforesaid description has been given by way of example only and it will be appreciated by a person skilled in the art that modifications may be made without departing from the scope of the present invention.

I claim:

1. An audio amplifier comprising a first current mirror having an input and ar output, a cascade differential pair having an output, a first constant current source having an output a second constant current source, a resistor, and a power supply line, said input of said first current mirror being coupled to said output of said cascade differential pair and said output of said first current mirror being coupled to said output of said first constant current source, said first constant current source comprising first and second transistors each having a base, a collector, and an emitter, said collector of said first transistor providing said output of said first constant current source, said base of said first transistor being coupled to said collector of said second transistor, said emitter of said first transistor being coupled to base of said second transistor and via said resistor to said power supply line, said emitter of said second transistor being coupled to said power supply line, said second constant current source being connected to said collector of said second transistor.

2. An audio amplifier as claimed in claim 1, in which said second constant current source comprises a second current mirror having an input coupled to a third constant current source.

3. An audio amplifier as claimed in claim 1, in which said audio amplifier is a two gain stage amplifier having a second gain stage which includes an emitter follower transistor coupled to a common emitter transistor and an internal capacitor for stabilising said amplifier.

* * * * *